United States Patent
Joshua et al.

(10) Patent No.: US 9,317,433 B1
(45) Date of Patent: Apr. 19, 2016

(54) MULTI-CORE PROCESSING SYSTEM HAVING CACHE COHERENCY IN DORMANT MODE

(71) Applicant: Marvell Israel (M.I.S.L) Ltd., Yokneam (IL)

(72) Inventors: Eitan Joshua, Ramot Menashe (IL); Tawfik Bayouk, Meilya Village (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 136 days.

(21) Appl. No.: 14/153,798

(22) Filed: Jan. 13, 2014

Related U.S. Application Data

(60) Provisional application No. 61/752,277, filed on Jan. 14, 2013, provisional application No. 61/761,483, filed on Feb. 6, 2013.

(51) Int. Cl.
    *G06F 12/00* (2006.01)
    *G06F 12/08* (2006.01)

(52) U.S. Cl.
    CPC .................................. *G06F 12/0831* (2013.01)

(58) Field of Classification Search
    CPC .......... G06F 12/0815; G06F 2212/621; G06F 1/3287; G06F 1/3203
    USPC .................................. 711/146, 138–141, 121
    See application file for complete search history.

(56) References Cited

U.S. PATENT DOCUMENTS

| | | | | |
|---|---|---|---|---|
| 8,918,591 B2 * | 12/2014 | Moyer | .......................... | 711/146 |
| 2014/0095801 A1 * | 4/2014 | Bodas et al. | .................. | 711/135 |

\* cited by examiner

*Primary Examiner* — Jasmine Song

(57) ABSTRACT

Some of the embodiments of the present disclosure provide a multi-core processing system configured to selectively enter a dormant mode, comprising: a plurality of processing cores; a plurality of cache memories, wherein a cache memory is associated with one or more corresponding processing cores; and a coherency fabric configured to transmit snoop commands to the respective caches to maintain data coherency in data stored in the respective caches, the coherency fabric comprising: a queue configured to intercept and store snoop commands that are directed to a first cache when a first processing core associated with the first cache is in the dormant mode.

18 Claims, 3 Drawing Sheets

MULTI-CORE PROCESSING SYSTEM HAVING CACHE COHERENCY IN DORMANT MODE

CROSS REFERENCE TO RELATED APPLICATIONS

The present application claims priority to U.S. Provisional Patent Application No. 61/752,277, filed on Jan. 14, 2013, and to U.S. Provisional Patent Application No. 61/761,483, filed on Feb. 6, 2013, the entire specifications of which are hereby incorporated by reference in their entirety for all purposes.

TECHNICAL FIELD

Embodiments of the present disclosure relate systems and methods for maintaining cache coherency, and more specifically, to cache coherency in a multi-core processing system.

BACKGROUND

Unless otherwise indicated herein, the approaches described in this section are not prior art to the claims in the present disclosure and are not admitted to be prior art by inclusion in this section.

In a multi-core processing system comprising a plurality of processing cores, in various conventional systems each processing core is associated with a corresponding cache. For example, a first processing core is associated with a first cache. The first processing core enters a dormant mode, based on, for example, a processing load of the system.

In a first example, while the first processing core is in the dormant mode, the first processing core receives a cache command associated with, for example, invalidating a cache line of the first cache, and such a cache command needs to be executed to maintain cache coherency among the caches of the system. The first processing core has to wake up from the dormant mode to execute such a cache command. Thus, the first processing core has to wake up frequently from the dormant mode, namely each time the first processing core receives such cache commands.

In a second example, prior to the first processing core entering the dormant mode, the first processing core cache flushes all the cache lines of the associated first cache (i.e., the first cache is emptied). Flushing the cache lines of the first cache ensures, for example, that while the first processing core is in the dormant mode, no cache command associated with invalidating a cache line of the first cache is received (as all the cache lines of the first cache is already flushed). However, as all the cache lines of the first cache are flushed, the hit ratio in the first cache is relatively low subsequent to the first processing core waking up from the dormant mode, thus adversely affecting the performance of the first cache.

SUMMARY

In various embodiments, the present disclosure provides a multi-core processing system configured to selectively enter a dormant mode, comprising: a plurality of processing cores; a plurality of cache memories, wherein a cache memory is associated with one or more corresponding processing cores; and a coherency fabric configured to transmit snoop commands to the respective caches to maintain data coherency in data stored in the respective caches, the coherency fabric comprising: a queue configured to intercept and store snoop commands that are directed to a first cache when a first processing core associated with the first cache is in the dormant mode.

In various embodiments, the present disclosure also provides a method comprising: transmitting snoop commands to a plurality of caches, ones of the plurality of caches being associated with a corresponding one or more processing cores of a plurality of processing cores of a multi-core processing system; intercepting and storing, in a queue, snoop commands that are directed to a first cache when a first processing core associated with the first cache is in a dormant mode; and providing queued snoop commands to the first processing core for processing, before processing other cache commands, when the first processing core exits the dormant mode.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the present disclosure. It is noted that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

DETAILED DESCRIPTION

Figure 1A:
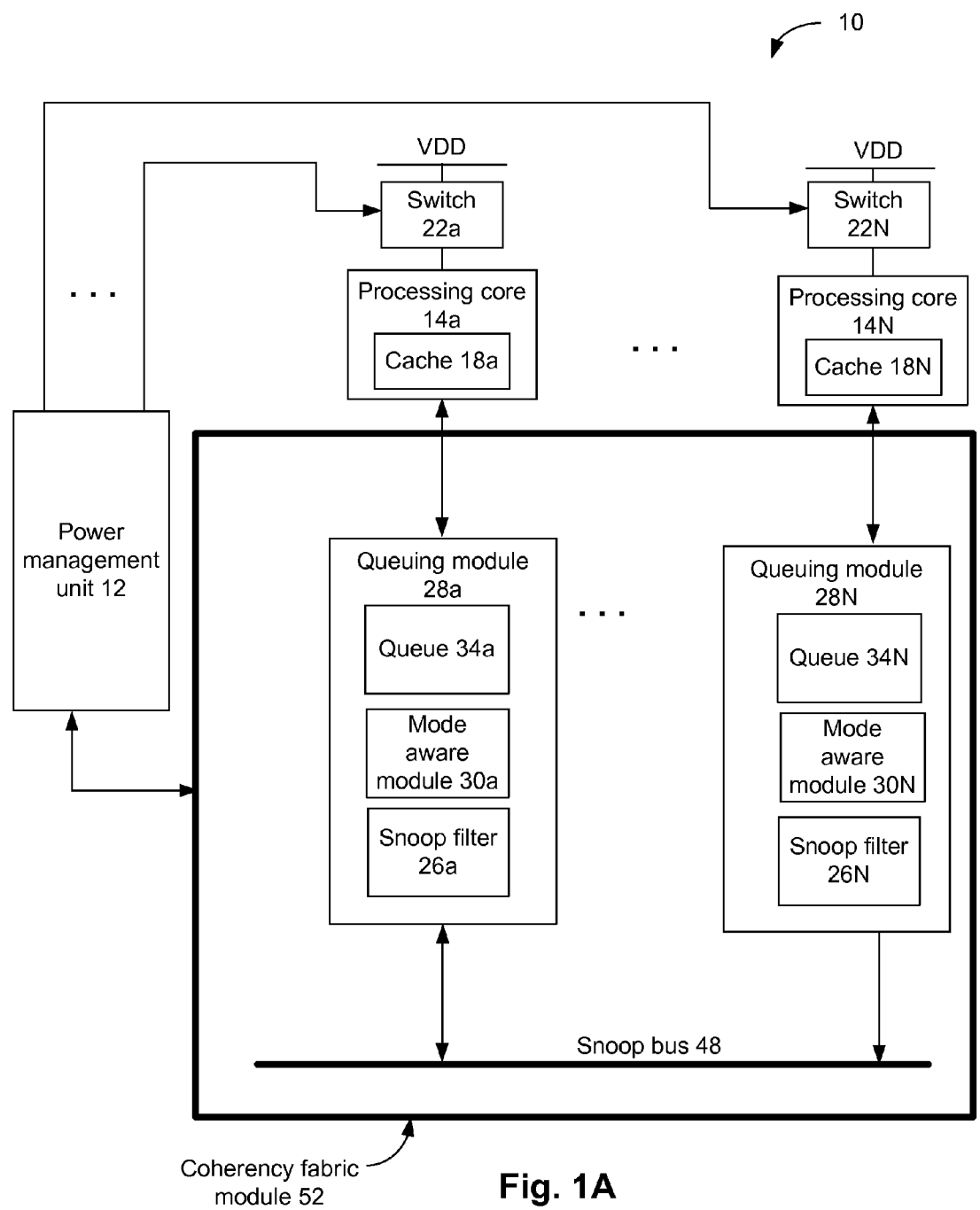
FIG. 1A schematically illustrates a multi-core processing system configured to selectively enter a dormant mode.

FIG. 1A schematically illustrates a multi-core processing system 10 (henceforth referred to as "system 10") configured to selectively enter a dormant mode, in accordance with an embodiment described herein. The system 10 comprises a plurality of processing cores 14a, ..., 14N. Each of the processing cores 14a, ..., 14N is associated with a corresponding cache. For example, the processing core 14a is associated with a cache 18a, the processing core 14N is associated with a cache 18N, and so on. Although FIG. 1A illustrates a single cache being included in the corresponding processing core (e.g., the cache 18a is illustrated to be included in the processing core 14a), in another example, the cache is external to the corresponding processing core. Furthermore, there may be one or more caches that are internal to a processor, as well as one or more caches that are external to the processor. The caches 18a, ..., 18N are, for example, one or more of a respective level 1 (L1) cache, a level 2 (L2) cache, and/or the like.

In an embodiment, each of the processing cores 18a, ..., 18N is coupled to a respective power supply via a corresponding switch (although in another embodiment, all the processing cores are coupled to a single power supply, via a respective switch). For example, the processing core 14a is coupled to a power supply via a switch 22a, the processing core 14N is coupled to a power supply via a switch 22N, and so on. Each of the switches 22a, ..., 22N is controlled by a power management unit 12. In an embodiment, the power management unit 12 is configured to facilitate a processing core to enter a dormant mode or a low power mode, e.g., by controlling the corresponding switch. In an example, while in the dormant mode, a processing core operates at a reduced voltage level, at a reduced frequency, consumes less power, and/or the like, compared to the operation of the processing core while in an active mode. In another example, while in the dormant mode, a processing core is not functional to execute instructions, and as such major parts of a logic of the processing core does not need power supply, and a clock associated with the processing core does not need to toggle. Also, while in the dormant mode, a state of an internal memory (e.g., a static random-access memory (SRAM)) is maintained. In another embodiment, the power management unit 12 is configured to facilitate the processing core to enter the dormant mode by any other means (e.g., by requesting the processing core to enter the dormant mode). The processing cores 14a, . . . , 14N selectively enter the dormant mode based on, for example, a processing load of the system 10, on a periodic basis, and/or the like.

In an embodiment, a coherency fabric module 52 is coupled to the processing cores 14a, . . . , 14N. As will be discussed in detail herein later, the coherency fabric module 52 enables the processing cores 18a, . . . , 18N to selectively enter the dormant mode, while maintaining cache coherency among the caches 18a, . . . , 18N (e.g., without requiring a processing core to wake up from the dormant mode each time the associated cache receives a cache snoop command). In an embodiment, the coherency fabric module 52 comprises a plurality of queuing modules 28a, . . . , 28N, where each queuing module is associated with a corresponding processing core. For example, the queuing module 28a is associated with the processing core 14a, the queuing module 28N is associated with the processing core 14N, and so on. A queuing module communicatively couples the corresponding processing core to a snoop bus 48. Each of the queuing modules 28a, . . . , 28N includes a corresponding queue. For example, the queuing module 28a comprises a queue 34a, the queuing module 28N comprises a queue 34N, and so on. In an embodiment, each of the queues 34a, . . . , 34N is a first-in first-out (FIFO) queue. In an embodiment, each of the queuing modules 28a, . . . , 28N includes a corresponding mode aware circuit and a corresponding snoop filter. For example, the queuing module 28a comprises a mode aware circuit 30a and a snoop filter queue 26a, the queuing module 28N comprises a mode aware circuit 30N and a snoop filter queue 26N, and so on.

In the system 10, each cache stores data in a corresponding plurality of cache lines. In an embodiment, a same data may be cached in more than one cache. For example, a first data is cached in cache lines of both caches 18a and 18N. When the first data in, for example, the cache line of the cache 18N is evicted or becomes dirty, the first data in the cache line of the cache 18a also needs to be tagged as dirty (i.e., the first data in the cache line of the cache 18a also need to be invalidated), e.g., to maintain cache coherency among the caches. Thus, in some situations, data stored in a cache needs to be invalidated, e.g., in order to maintain coherency among the caches. In an embodiment, a cache (e.g., the cache 18a) receives an invalidation request (e.g., via the snoop bus 48) from another processing core (e.g., from the processing core 14N) or another cache, to maintain cache coherency. In another example, a processing core (e.g., the processing core 14N) wants to read data cached in the cache 18a that is not associated with the processing core. In such an example, the processing core transmits a read request to the cache, e.g., via the snoop bus 48. Such invalidation requests, read requests, and/or the like (e.g., any other appropriate cache requests), transmitted over the snoop bus 48 to the caches, are referred to herein as cache commands, cache snoop commands, or snoop commands.

In an embodiment and as will be discussed in detail herein later, a snoop filter (e.g., the snoop filter 26a) associated with a cache (e.g., the cache 18a) receives a plurality of snoop commands from the snoop bus 48. The snoop filter outputs only those cache commands that are valid and are directed to the corresponding cache (e.g., cache 18a). In an embodiment and as will be discussed in detail herein later, a mode aware module (e.g., mode aware module 30a) is configured to determine if the corresponding processing core (e.g., processing core 14a) is operating in the dormant mode. In an embodiment and as will be discussed in detail herein later, one of the processing cores 14a, . . . , 14N of the system 10 selectively enters the dormant mode, based on, for example, a processing load of the processing core. As an example, when the processing core 14a enters the dormant mode, in an embodiment, the coherency fabric module 52 is configured to transmit snoop commands to the caches of the system 10. Then, while the processing core 14a is in the dormant mode (e.g., as determined by the mode aware module 30a), the coherency fabric module 52 (e.g., the queue 34a) is configured to intercept and store snoop commands directed to the cache 18a (e.g., store those snoop commands that are output by the snoop filter 26a and are required to maintain coherency among the caches of the system 10, i.e., store invalidation requests directed to the cache 18a). In an embodiment, while the processing core 14a is in the dormant mode, the coherency fabric module 52 (e.g., the queue 34a) is configured to intercept and store the snoop commands directed to the cache 18a, without waking up the processing core 14a from the dormant mode each time a snoop command is received. In an embodiment, the coherency fabric module 52 (e.g., the queue 34a) is further configured to provide one or more of the stored snoop commands to the processing core 14a for processing, upon the processing core 14a waking up from the dormant mode and before the processing core 14a processes other cache commands associated with the cache 18a.

Figure 1B:
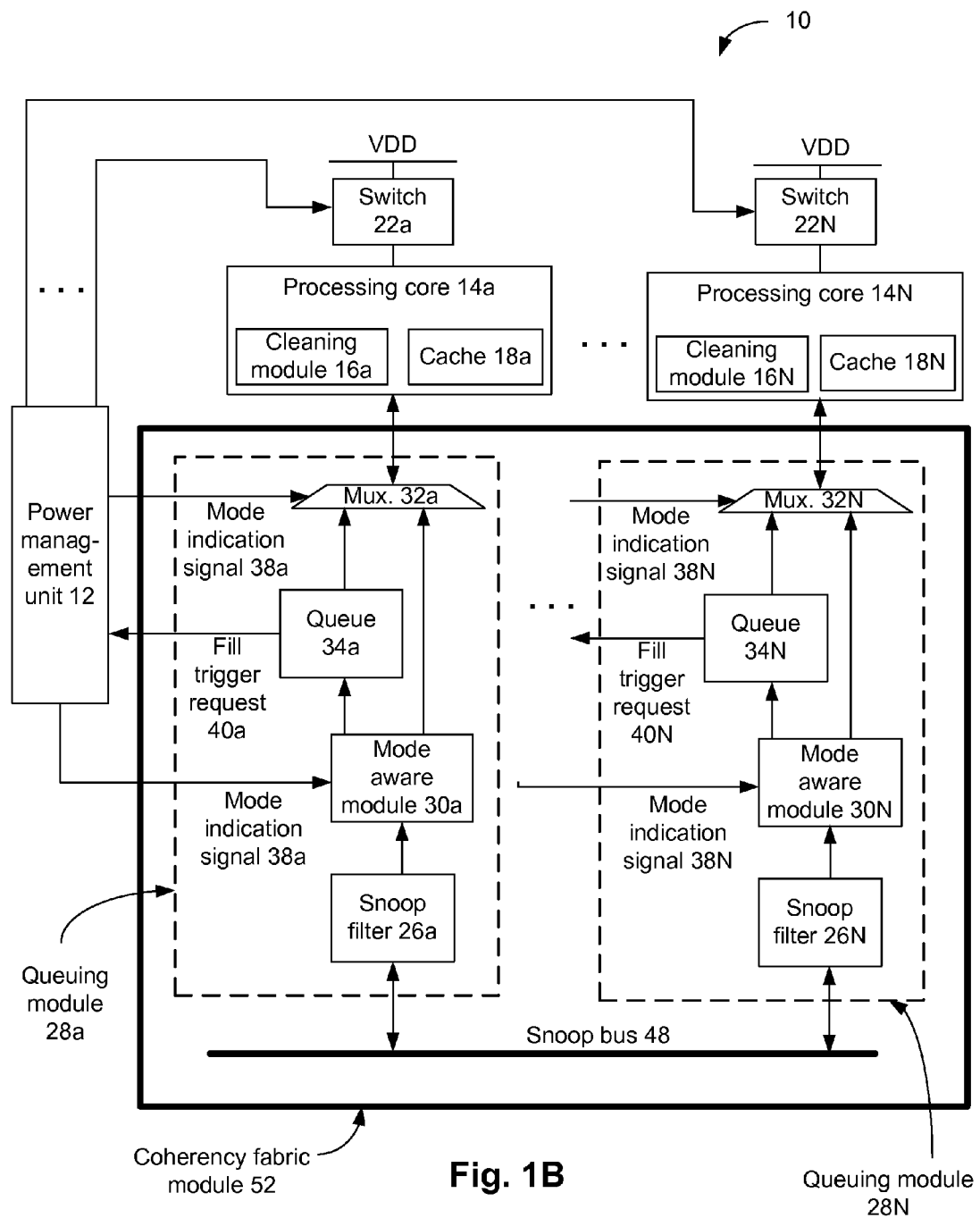
FIG. 1B illustrates an example implementation including details for various components of the system of FIG. 1A.

FIG. 1B illustrates an example implementation including details of various components of the system 10 of FIG. 1A. In the example of FIG. 1B, the queuing modules 28a, . . . , 28N are illustrated using dotted lines, for illustrative purposes. As previously discussed, in an embodiment, each queuing module comprises a corresponding snoop filter, a corresponding mode aware module, a corresponding multiplexer (labeled as "mux." in FIG. 1B), and the corresponding queue. For example, the queuing module 28a comprises the snoop filter 26a, the mode aware module 30a, the queue 34a, and a multiplexer 32a. Similarly, the queuing module 28N comprises the snoop filter 26N, the mode aware module 30N, the queue 34N, and a multiplexer 32N.

In at least some sections of this disclosure, operations of the queuing module 28a are discussed in detail. Such discussion of operations of the queuing module 28a is applicable to one or more of the other queuing modules (e.g., to the queuing modules 28b, . . . , 28N) of the system 10.

In an embodiment, a snoop filter (e.g., the snoop filter 26a) associated with a cache (e.g., the cache 18a) receives a plurality of snoop commands from the snoop bus 48. The snoop filter outputs, to the corresponding mode aware module (e.g., to the mode aware module 30a), only those cache commands that are valid and are directed to the corresponding cache (e.g., cache 18a). Thus, the snoop filter filters out the snoop commands that are not directed to the corresponding cache, or that are not valid, and passes to the corresponding mode aware circuit only those cache commands that are valid and are directed to the corresponding cache.

In an embodiment, each mode aware module receives, from the power management module 12, a corresponding mode indication signal. For example, the mode aware module 30a receives, from the power management module 12, a corresponding mode indication signal 38a; the mode aware module 30N receives, from the power management module 12, a corresponding mode indication signal 38N; and so on (although in FIG. 1B, for illustrative purposes, only the mode indication signal 38a is illustrated to originate from the power management unit 12, other mode indication signals also originate from the power management unit 12). A mode aware module is configured to determine, based on the corresponding mode indication signal, if the corresponding processing core is operating in the dormant mode. For example, if the power management unit 12 facilitates the processing core 14a to enter in the dormant mode, the power management unit 12 notifies the mode aware circuit 30a, via the mode indication signal 38a, about the processing core 14a entering the dormant mode. Thus, based on the mode indication signal 38a, the mode aware circuit 30a is aware of whether the processing core 14a is currently operating in the dormant mode or in any other mode (e.g., in the active mode).

In an embodiment, based on determining a mode of a processing core (e.g., processing core 14a), the corresponding mode aware module (e.g., mode aware module 30a) selectively transmits snoop commands receives from the corresponding snoop filter (e.g., snoop filter 26a) to either (i) the corresponding queue (e.g., queue 34a), or (ii) the corresponding multiplexer (e.g., multiplexer 32a). For example, while the processing core 14a is operating in the dormant mode, the corresponding mode aware module 30a transmits the snoop commands to the corresponding queue 34a; and while the processing core 14a is operating in the active mode, the corresponding mode aware module 30a transmits the snoop commands to the corresponding multiplexer 32a. In an embodiment, immediately after the processing core 14a transitions from the dormant mode to the active mode, the corresponding mode aware module 30a continues transmitting the snoop commands to the corresponding queue 34a for at least a threshold time period (e.g., to provide the processing core 14a sufficient time to process snoop commands already queued in the queue 34a). Subsequent to the threshold time period, the mode aware module 30a starts transmitting the snoop commands to the corresponding multiplexer 32a, and continues doing so while the processing core 14a remains in the active mode.

In an embodiment, while a processing core (e.g., processing core 14a) is operating in the dormant mode (or has just entered the active mode from the dormant mode), the corresponding queue (e.g., queue 34a) queues snoop commands that are output by the corresponding snoop filter (e.g., the snoop filter 26a). In an example, the queue 34a is configured to store snoop commands directed to the cache 18a in an order in which the snoop commands are received by the queue 34a, and when necessary (e.g., when the processing core 14a transitions to the active mode), outputs the stored snoop commands in the order in which the snoop commands are received and stored in the queue 34a. That is, the queue 34a acts as a FIFO queue.

As discussed, while a processing core (e.g., processing core 14a) is operating in the dormant mode (or has just entered the active mode from the dormant mode), the corresponding queue (e.g., queue 34a) queues snoop commands that are output by the corresponding snoop filter (e.g., the snoop filter 26a). While the processing core has transitioned to the active mode, the queue outputs the stored snoop commands to the corresponding multiplexer. Thus, for example, the multiplexer 32a receives snoop commands directly from the mode aware circuit 30a (e.g., by bypassing the queue 34a) while the processing core 14a is operating in the active mode, and receives snoop commands from the queue 34a subsequent to the processing core 14a has transitioned from the dormant mode to the active mode. In an embodiment, the multiplexer 32a also receives the mode indication signal 38a from the power management unit 12 (i.e., the multiplexer 32a is also aware of the operating mode of the processing core 14a). Based on the operating mode of the processing core 14a, the multiplexer 32a selectively transmits snoop commands from the queue 34a and the mode aware circuit 30a to the processing core 14a. While the processing core 14a is in the dormant mode, the multiplexer 32a refrains from transmitting any snoop command from the queue 34a or the mode aware circuit 30a to the processing core 14a. Thus, while the processing core 14a is in the dormant mode, the processing core 14a need not wake up to process any snoop commands. During this time, any snoop command received by the queuing module 28a is queued in the queue 34a.

When the processing circuit 14a wakes up (e.g., transitions from the dormant mode to the active mode), the queue 34a starts transmitting the queued snoop commands to the processing core 14a via the multiplexer 32a. During this time (i.e., while the processing core 14a is still processing snoop commands from the queue 34a), the mode aware circuit 30a continues queuing snoop commands in the queue 34a (e.g., as the processing core 14a needs to process the queued snoop commands first, and then process snoop commands that are currently received by the snoop filter 26a). Subsequent to the processing core 14a processing all the snoop commands that were queued in the queue 34a, the mode aware circuit 30a starts transmitting snoop commands, which are received from the snoop filter 26a, directly to the processing core 14a via the multiplexer 32a (e.g., by bypassing the queue 34a).

As previously discussed, snoop commands comprises, for example, invalidation requests to invalidate one or more cache lines of a cache, read requests to read cache lines of a cache, and/or the like. For example, as previously discussed, the processing core 14N (or the corresponding cache 18N) transmits an invalidation request to the processing core 14a, to invalidate a cache line of the cache 18a, in an embodiment. The invalidation request needs to be executed, in order to maintain cache coherency among the caches of the system 10. In another example embodiment, the processing core 14N transmits a read request to the processing core 14a (or the cache 18a), to read a cache line of the cache 18a. If, for example, the read request is not processed (e.g., as the processing core 14a is in the dormant mode), the processing core 14N can get the corresponding data directly from a memory associated with the cache 18a. Thus, while the invalidation request needs to be executed to maintain cache coherency among the caches of the system 10, the read request is not necessary for maintaining cache coherency among the caches of the system 10. In an embodiment, while the processing core 14a is in the dormant mode, and the queue 34a queues only those snoop commands that are associated with maintaining cache coherency among the caches of the system 10, and drops (or does not queue) those snoop commands that are not associated with maintaining such cache coherency. For example, while the processing core 14a is in the dormant mode, and the queue 34a queues only those snoop commands that are associated with invalidating cache lines (e.g., invalidation requests), and does not queue other snoop commands. The filtering of the invalidation requests from other snoop commands can be performed, for example, by the queue 34a, the mode aware module 30a and/or the snoop filter 26a.

Alternatively, in another embodiment, the queue 34a queues all snoop commands, e.g., irrespective of, or independent of whether the snoop commands are associated with maintaining cache coherency.

In an embodiment, while the processing core 14a is in the dormant mode and the queue 34a queues snoop commands, the queue 34a can queue only a finite number of snoop commands. To prevent overflow of the queue 34a, in an embodiment, the queue 34a facilitates waking up of the processing core 14a once a threshold percentage of the queue 34a is filled with snoop commands (i.e., the queue 34a reaches a predetermined fill level). Merely as an example, when 95% of the queue 34a is filled with snoop commands, the queue 34a facilitates waking up of the processing core 14a. Thus, in this example, the threshold percentage is 95%. The queue 34a does not wait to be fully filled to facilitate such waking up, as waking up the processing core 14a from the dormant mode to the active mode takes some time, and the remaining 5% of the queue 34a is to be used to store snoop commands that are received while the processing core 14a transitions form the dormant mode to the active mode. In an embodiment, the queue 34a facilitates waking up the processing core 14a by, for example, issuing a fill trigger request 40a to the power management unit 12. In response to receiving the fill trigger request 40a, the power management unit 12 facilitates waking up the processing core 14a by, for example, controlling the switch 22a or by directly issuing a request to the processing core 14a to wake up. The power management unit 12 also receives fill trigger requests 40b, . . . , 40N respectively from queues 34b, . . . , 34N, although FIG. 1B does not illustrate these other fill trigger requests reaching the power management unit 12, for illustrative purposes.

In an embodiment, the processing core 14a comprises a corresponding cleaning module 16a, the processing core 14N comprises a corresponding cleaning module 16N, and so on. In an embodiment, a cleaning module (e.g., the cleaning module 16a) is configured to perform a clean operation on the corresponding cache (e.g., cache 18a) by synchronizing the cache with a memory (not illustrated in FIG. 1B) coupled to the cache, prior to the corresponding processing core (e.g., processing core 14a) entering the dormant mode. As an example, any cache operation (e.g., updating, invalidation, and/or the like) that are currently pending are performed (e.g., by the cleaning module 16a) prior to the processing core 14a entering the dormant mode. This ensures, for example, that the cache lines of the cache 18a are current or synchronized with the external memory when the processing core 14a enters the dormant mode.

As discussed, the queuing modules 28a, . . . , 28N facilitate the corresponding processing cores 14a, . . . , 14N to selectively enter the dormant mode, without requiring the processing cores to exit the dormant mode each time a snoop command (e.g., a snoop command to invalidate a cache line) is received. Storing the snoop commands associated with invalidating the cache lines of the caches in the corresponding queues facilitates maintaining cache coherency among the caches of the system 10, without requiring a processing core to exit the dormant mode each time a snoop command to invalidate a cache line of the associated cache is received.

Figure 2:
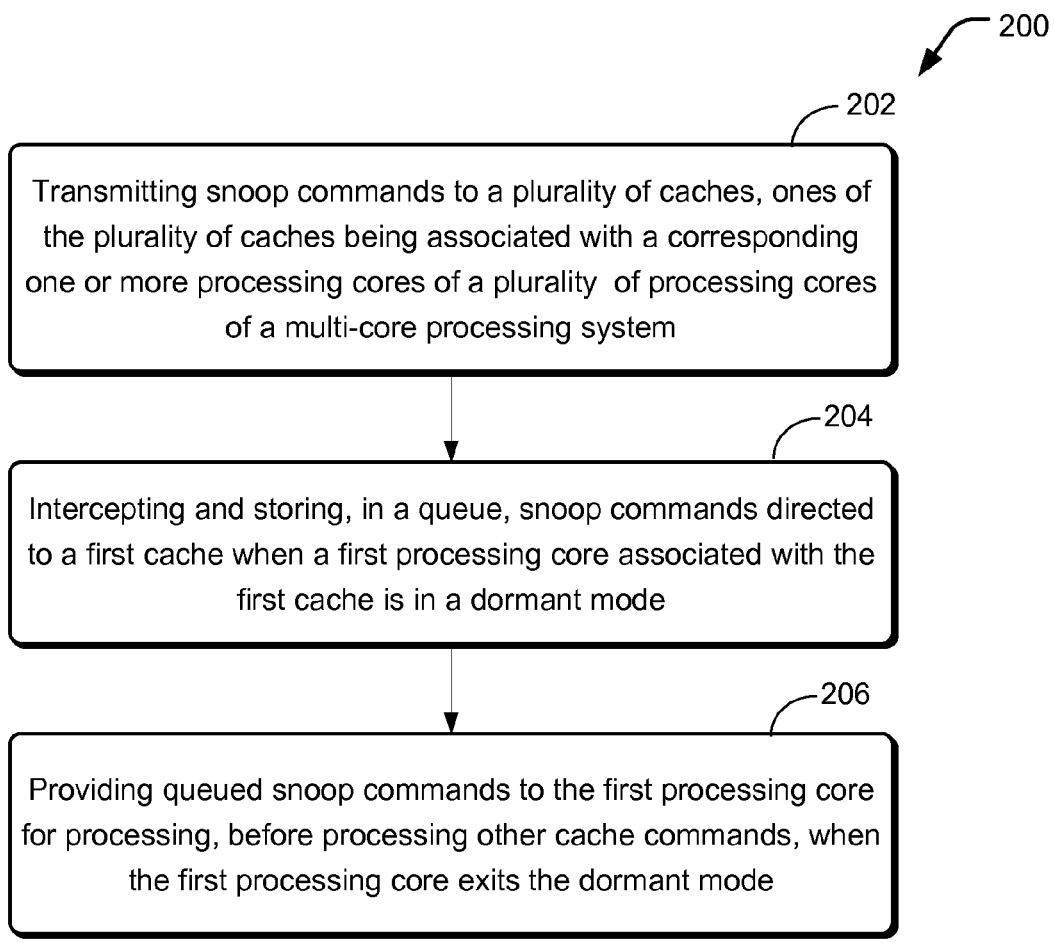
FIG. 2 is a flow diagram illustrating an example method for operating the system of FIGS. 1A and 1B.

FIG. 2 is a flow diagram illustrating an example method 200 for operating the system 10 of FIGS. 1A and 1B. At 202, snoop commands are transmitted to a plurality of caches (e.g., caches 18a, . . . , 18N), ones of the plurality of caches being associated with a corresponding one or more processing cores (e.g., cache 18a being associated with the processing core 14a) of a plurality of processing cores (e.g., processing cores 14a, . . . , 14N) of a multi-core processing system (e.g., system 10). At 204, snoop commands directed to a first cache (e.g., cache 18a) are intercepted and stored in a queue (e.g., queue 34a), when a first processing core (e.g., processing core 14a) associated with the first cache is in a dormant mode. At 206, when the first processing core exits the dormant mode, the queued snoop commands are provided to the first processing core for processing, before the processing core processes other cache commands that are received subsequent to the processing core exiting the dormant mode.

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A multi-core processing system comprising:
 a plurality of processing cores;
 a plurality of cache memories, wherein a cache memory is associated with one or more corresponding processing cores; and
 a coherency fabric configured to transmit snoop commands to the respective caches to maintain data coherency in data stored in the respective caches, the coherency fabric comprising:
  a snoop filter configured to (i) receive a plurality of snoop commands, (ii) while a first processing core is in a dormant mode, store in a queue first one or more snoop commands that are valid and that are directed to a first cache associated with the first processing core that is in the dormant mode, and (iii) while the first processing core is not in the dormant mode, transmit to the first cache, by bypassing the queue, second one or more snoop commands that are directed to the first cache.

2. The multi-core processing system of claim 1, wherein the snoop filter is further configured to receive and store in the queue the first one or more snoop commands directed to the first cache when the first processing core is in the dormant mode, without waking up the first processing core associated with the first cache.

3. The multi-core processing system of claim 1, wherein the queue is further configured to provide the stored first one or more snoop commands to the first processing core for processing, upon the first processing core waking up from the dormant mode and before the first processing core processing other commands associated with the cache.

4. The multi-core processing system of claim 3, wherein the queue is further configured to (i) when the first processing core is in the dormant mode, store the first one or more snoop commands directed to the first cache in an order in which the first one or more snoop commands are received by the queue, and (ii) upon the first processing core waking up from the dormant mode, provide the stored first one or more snoop commands to the first processing core for processing in the order in which the first one or more snoop commands are received and stored by the queue.

5. The multi-core processing system of claim 1, wherein the queue is a first-in first-out (FIFO) queue.

6. The multi-core processing system of claim 1, wherein the snoop filter is associated with the first processing core and is further configured to filter out snoop commands that are (a) invalid or (b) directed to caches other than the first cache.

7. The multi-core processing system of claim 1, further comprising:
   a power management unit coupled to the first processing core and to the queue, the power management unit configured to selectively cause the first processing core to (i) enter the dormant mode, and (ii) in response to the queue being filed with the snoop commands to a predetermined fill level, wake up from the dormant mode.

8. The multi-core processing system of claim 1, further comprising:
   a mode aware module configured to determine if the first processing core is operating in the dormant mode.

9. The multi-core processing system of claim 1, further comprising:
   a cleaning module configured to perform a clean operation on the first cache by synchronizing the first cache with a memory coupled to the first cache, prior to the first processing core entering the dormant mode.

10. The multi-core processing system of claim 1, wherein a snoop command directed to the first cache is received from a second processing core that is not in the dormant mode.

11. The multi-core processing system of claim 1, wherein a snoop command directed to the first cache comprises a command to invalidate a cache line in the first cache.

12. A method for processing snoop commands in a multi-core processing system, the method comprising:
   transmitting snoop commands to a plurality of caches, ones of the plurality of caches being associated with a corresponding one or more processing cores of a plurality of processing cores of a multi-core processing system;
   when a first processing core associated with the first cache is in a dormant mode, intercepting and storing, in a queue, first one or more snoop commands that are directed to a first cache associated with the first processing core;
   providing the queued first one or more snoop commands to the first processing core for processing, before processing other cache commands, when the first processing core exits the dormant mode; and
   when the first processing core is not in the dormant mode, transmitting, to the first cache by bypassing the queue, second one or more snoop commands that are directed to the first cache.

13. The method of claim 12, wherein intercepting and storing the first one or more snoop commands directed to the first cache further comprises:
   intercepting and storing, in the queue, the first one or more snoop commands directed to the first cache when the first processing core associated with the first cache is in the dormant mode, without waking up the first processing core associated with the first cache.

14. The method of claim 12, wherein:
   intercepting and storing the first one or more snoop commands directed to the first cache further comprises:
      storing, in the queue, the first one or more snoop commands directed to the first cache in an order in which the first one or more snoop commands are received at the queue; and
   providing the queued first one or more snoop commands to the first processing core further comprises:
      providing the queued first one or more snoop commands to the first processing core for processing, in the order in which the first one or more snoop commands are stored in the queue.

15. The method of claim 12, further comprising:
   receiving a plurality of snoop commands; and
   filtering, by a snoop filter, the plurality of snoop commands to output snoop commands that are directed to the first cache.

16. The method of claim 12, further comprising:
   selectively causing, by a power management unit, the first processing core to (i) enter the dormant mode, and (ii) in response to the queue being filed with the snoop commands to a predetermined fill level, wake up from the dormant mode.

17. The method of claim 12, further comprising:
   determining if the first processing core is operating in the dormant mode; and
   based on determining whether the first processing core is operating in the dormant mode, selectively providing the snoop commands to (i) the cache by bypassing the queue, or (ii) the queue.

18. The method of claim 12, further comprising:
   performing a clean operation on the first cache by synchronizing the first cache with a memory coupled to the first cache, prior to the first processing core entering the dormant mode.

* * * * *